(12) United States Patent
Faber et al.

(10) Patent No.: US 12,596,020 B2
(45) Date of Patent: Apr. 7, 2026

(54) ELECTRICAL END DEVICE, MANUFACTURING METHOD AND ADJUSTMENT METHOD

(71) Applicant: Turck Holding GmbH, Halver (DE)

(72) Inventors: Michael Faber, Altena (DE); Nikolaj Löwen, Wuppertal (DE)

(73) Assignee: Turck Holding GmbH, Halver (DE)

( * ) Notice: Subject to any disclaimer, the term of this patent is extended or adjusted under 35 U.S.C. 154(b) by 168 days.

(21) Appl. No.: 18/506,319

(22) Filed: Nov. 10, 2023

(65) Prior Publication Data

US 2024/0175730 A1 May 30, 2024

(30) Foreign Application Priority Data

Nov. 25, 2022 (DE) ..................... 10 2022 131 236.4

(51) Int. Cl.
*G01D 11/24* (2006.01)
*H05K 5/02* (2006.01)
(52) U.S. Cl.
CPC ......... *G01D 11/245* (2013.01); *H05K 5/0221* (2013.01); *H05K 5/0226* (2013.01); *H05K 5/0247* (2013.01)
(58) Field of Classification Search
CPC .... G01D 11/245; G01D 11/30; H05K 5/0221; H05K 5/0226; H05K 5/0247;
(Continued)

(56) References Cited

U.S. PATENT DOCUMENTS

| | | | | |
|---|---|---|---|---|
| 4,314,310 A | * | 2/1982 | Schmidt ............. | H03K 17/9505 |
| | | | | 361/837 |
| 4,594,762 A | | 6/1986 | Och | |

(Continued)

FOREIGN PATENT DOCUMENTS

| | | |
|---|---|---|
| DE | 3407551 A1 | 9/1985 |
| DE | 196 18 664 C2 | 3/1998 |

(Continued)

OTHER PUBLICATIONS

German Search Report issued in DE 10 2022 131 236.4, to which this application claims priority, mailed Jun. 28, 2023 (English language machine translation enclosed).

(Continued)

*Primary Examiner* — Benyam Ketema
(74) *Attorney, Agent, or Firm* — Pearl Cohen Patentanwälte Part GmbB; Michael McCandlish

(57) ABSTRACT

An electrical terminal has a multi-sided housing with a basic element and includes at least two rear sides and a head element. The head element is designed as a detection and/or functional element and includes a detection and/or functional side. A mounting element has a mounting body with at least two side surfaces, a base side and an inner wall, and two rear sides. The mounting element and/or the mounting body is connected to the basic element via a rotary bearing unit, which has an axis of rotation, wherein the basic element is pivotable about the axis of rotation, and the basic element has a single- or multi-part foot surface, and the mounting element and/or the mounting body has a single- or multi-part bearing surface. The foot surface and the bearing surface lie against each other at least with a partial area in an inoperative position of the basic element.

15 Claims, 10 Drawing Sheets

(58) Field of Classification Search
  CPC .... H05K 5/0204; H05K 5/0234; H01R 35/02;
                              F16M 11/06
  See application file for complete search history.

(56) References Cited

U.S. PATENT DOCUMENTS

| | | | | |
|---|---|---|---|---|
| 4,785,240 | A * | 11/1988 | Newell | H03K 17/9505 |
| | | | | 439/13 |
| 5,239,130 | A * | 8/1993 | Brasse | H03K 17/945 |
| | | | | 340/693.9 |
| 6,655,986 | B2 * | 12/2003 | Kroll | H03K 17/9505 |
| | | | | 439/534 |
| 7,667,614 | B2 | 2/2010 | Helm et al. | |
| 9,157,772 | B2 * | 10/2015 | Santos | G01D 11/245 |
| 11,404,819 | B2 * | 8/2022 | Reinhardt | H01R 13/6272 |
| 2002/0057199 | A1 * | 5/2002 | Kroll | H03K 17/9505 |
| | | | | 340/541 |
| 2019/0044267 | A1 * | 2/2019 | Lui | H01R 13/665 |
| 2019/0178741 | A1 * | 6/2019 | Roehlig | G01L 19/0084 |
| 2024/0125630 | A1 * | 4/2024 | Makkinga | H03K 17/9505 |
| 2024/0175730 | A1 * | 5/2024 | Faber | G01D 11/30 |

FOREIGN PATENT DOCUMENTS

| | | | |
|---|---|---|---|
| DE | 10147023 | A1 | 4/2003 |
| DE | 202013000384 | U1 | 5/2013 |
| WO | 2004047246 | A1 | 6/2004 |

OTHER PUBLICATIONS

Extended European Search Report issued in 23 209 336.9, which is
a counterpart hereof, mailed Apr. 23, 2024 (English-language machine
translation attached).

* cited by examiner

ELECTRICAL END DEVICE, MANUFACTURING METHOD AND ADJUSTMENT METHOD

CROSS REFERENCE TO RELATED APPLICATIONS

This application claims priority to German patent application DE 10 2022 131 236.4 filed on Nov. 25, 2022, which is hereby incorporated by reference in its entirety.

TECHNICAL FIELD

The present disclosure relates to electrical terminals having a basic element connected to a mounting element and/or mounting body in which the basic element can be adjusted relative to the mounting element and/or mounting body.

BACKGROUND

Holders for sensors or other terminal devices that predetermine a fixed alignment of the sensor to the holder or are designed to be adjustable are known from the related art.

An important feature of such sensors and terminals is that the position of the active surface, such as the detection side, can be adapted to the current conditions in the field.

For example, the WO 2004/047246 A1 discloses a holder in the form of a housing for receiving an electric sensor, which furthermore has a display device for displaying different electrical states from different viewing directions. In this housing, the sensor is fixed in its alignment with respect to the housing, and therefore the entire housing has to be changed in alignment if the sensor is intended to be realigned.

DE 10147023 A1 proposes an improvement in this respect, in that a fastening device for sensors is equipped with a housing for receiving the sensor, wherein a separate mounting plate is provided for fastening to an underlying surface, and therefore, between the housing and the mounting plate, fastening means are provided for the releasable mounting of the housing on the mounting plate. By this means, the fastening means are designed in such a way that the alignment of the housing with respect to the mounting plate is adjustable. DE 10147023 A1 furthermore discloses that the alignment of the housing with respect to the mounting plate can be gradually adjustable by 90° in each case.

This fastening element is basically readily suitable for allowing different alignments for an electrical terminal, but easier handling of the fastening element and/or of the electrical terminal would still be desirable.

SUMMARY

It is an object of the present disclosure to provide an improved fastening element and an improved electrical terminal.

This object is achieved according to the disclosure by an electrical terminal a multi-sided housing with a basic element and a head element, to a production method including connecting the mounting element to the basic element, and to an adjustment method for the terminal in which the basic element is lifted off of the mounting element. Exemplary embodiments are specified in detail below.

Accordingly, the problem is solved by an electrical terminal which comprises a multi-sided housing with a basic element and a mounting element. The basic element has at least two rear sides and a head element, wherein the head element is designed as a detection and/or functional element and comprises a detection and/or functional side. The mounting element has at least one mounting body with at least two side surfaces, a base side and an inner wall, and also two rear sides. In this case, the mounting element and/or the mounting body are connected to the basic element via a rotary bearing unit, which has an axis of rotation, the basic element being pivotable about the axis of rotation.

Furthermore, i) the basic element has a single- or multi-part foot surface, and ii) the mounting element and/or the mounting body has a single- or multi-part bearing surface, the foot surface and the bearing surface lying against each other at least with a partial area in an inoperative position of the basic element, and the at least one partial area spanning a theoretical contact plane, which is inclined in relation to the detection and/or functional side and/or a rear side by an angle of inclination, in particular by an angle of inclination of 45°, and the axis of rotation being aligned perpendicularly to the theoretical contact plane, the bearing surface and/or the foot surface. In this case, the basic element is displaceable from the inoperative position in the direction of the axis of rotation and can be brought into an adjustment position, wherein the rotary bearing unit comprises a spring element and is formed and mounted in such a way that a spring force acts on the foot surface in the direction of the bearing surface and/or the contact plane by means of the spring element.

In other words, the basic element is lifted from the mounting element out of the inoperative position such that the foot surface of the basic element is spaced apart from the bearing surface of the mounting element or the mounting body, and this constitutes the alignment position in which the basic element can be pivoted about the axis of rotation. During this lifting and holding in the adjustment position, the spring element acts with a restoring spring force in the direction of the inoperative position.

It is understood by a skilled person that the terminal can be attached and operated in any position and alignment and that the alignment at least of the basic element can be changed by pivoting the basic element on the mounting element even after the mounting element and/or the mounting body has been mounted. Thus, all of the information that implies an alignment of the terminal or parts thereof, such as "rear side," "side surface," "top." "bottom," etc., are used for the linguistic presentation and should not be understood as limiting, unless something different is expressly stated.

This assumes a superior basic alignment (hereinafter also referred to as "longitudinal alignment") of the terminal in a Cartesian coordinate system with the axes x-y-z, in which a plug axis runs parallel or congruently to the main axis of the terminal parallel to the x-axis and the end or functional side of the head element is perpendicular or substantially perpendicular to the main axis or the plug axis. In this case, the connection side of the mounting element is parallel or substantially parallel to the functional side. The main axis is defined by the fact that it is perpendicular to the detection side or end face of the head element.

With regard to the theoretical contact plane, this means, in the case of the basic alignment of the terminal, that the end face is aligned parallel to the y-z axes, wherein the theoretical contact plane is parallel to the z axis and inclined opposite to the y axis by an angle of inclination of in particular 45°. In this case, the axis of rotation is perpendicular to the theoretical contact plane.

The corner alignment of the terminal differs from the basic or longitudinal alignment in that the plug axis and the main axis are not aligned parallel.

The corner alignment is provided in particular and is primarily meant below if the detection side or end face is aligned parallel to the x-z axis and/or is aligned perpendicular to the connection side.

The angle of inclination of the bearing surface correlates with the desired alignment and number of alignments of the electrical terminal and in principle is not restricted. In the case of the conventional vertical support elements, it is advantageous if the angle of inclination is 45° or an integer fraction thereof, such as 45°/2 or 45°/3, such that, among other things, an alignment changed to 90° from a first inoperative position to a second inoperative position of the electrical terminal can be reached in a rotational angle position.

Advantageously, the mounting body has at least one fastening element, in particular a plurality of fastening elements, and therefore the mounting body can be fastened to a support element.

The mounting element and the electrical terminal can be attached in principle to any type of support element, and therefore "support element" should not be understood as limiting and in particular can be a wall, a carrier, a support, a holding arm and/or another load-bearing and/or supporting component.

A fastening element should be understood here as meaning in particular each element which can receive, guide and/or hold a fastening means, such as, for example, a screw. A fastening element here is in particular an eye, a bore and/or a nut thread, in particular an eye, bore and/or nut thread open on both sides.

In particular, it may be advantageous if the fastening element is a through bore, through nut, a nut thread section or a through eye. In this way, when the mounting elements are fastened on or to a support element, a final, permanent securing relative to the mounting element is also carried out for the terminal.

The terminal is advantageously cuboid and in particular cube-shaped or very substantially dimensioned in a cube-shaped manner.

A further improvement consists in that the fastening elements are at least two pairs of parallel fastening elements, wherein in each case one pair of parallel fastening elements is perpendicular to the other pair of parallel fastening elements, and wherein the axes thereof span a common plane. Here, the fastening elements in particular represent two pairs of through bores and/or through threads. Advantageously, the distances between the fastening elements of both pairs are identical or substantially identical, and therefore the attachment of the terminal to a support element is possible in every 90° position, without having to make changes to the support element and fastening elements there.

The rear side of the basic element can be formed in one or more parts and is defined by the possibility of being able to be brought directly opposite and/or into contact with the inner wall of the mounting body. Pivoting of the basic body enables the rear side to form a common (outer) side with the base side of the mounting body or to be arranged opposite the inside or to lie at least partially against the latter, in contact therewith. Advantageously, in one exemplary embodiment at least one of the rear sides is formed partially from a portion of the basic element and a portion of the head element.

The inner wall of the mounting body is formed by a wall or surface lying opposite the use side in the direction of the main axis, in particular lying opposite in parallel or substantially parallel.

In one exemplary embodiment, the head element and/or basic element is in each case formed monolithically, in particular from a cast material, such as a plastic or a metal casting. This does not apply to the electrical components and associated carrier elements, such as a printed circuit board and sealing and/or connecting elements. In one exemplary embodiment, at least a part of the rotary bearing unit is on a partial section of the basic element or of the mounting body; in particular, it is advantageous if a part of the rotary bearing element is designed as a monolithic part of the basic element and a part of the rotary bearing element is designed as a monolithic part of the mounting body.

In the present case, "monolithically" means that the parts or modules mentioned form a single element cast in a single mold or have been formed from a single solid material by material removal.

Advantageously, the head element and the basic element form a constructional unit with a substantially common interior consisting of the basic element interior and the head element interior. Advantageously, the electrical components and/or their carrier elements are fastened in the head element, with them being able to protrude into the basic element interior.

In this case, "bearing surface" of the mounting element or body should not be understood as limiting as a single continuous surface. Rather, "bearing surface" should also be understood as meaning a plurality of partial areas or surface regions on or against which the "foot surface" of the basic element lies in the inoperative position. The partial areas can be, for example, edge surfaces of the side walls and/or separate bearing surfaces. The above applies in an analogous manner to the foot surface of the basic body, because the bearing surface of the mounting element and the contacting foot surface of the basic body span the common, theoretical contact plane as complementary surfaces.

An adjustment position should be understood here as meaning any position along the axis of rotation outside the inoperative position, in which it is possible to rotate the basic element about the axis of rotation.

Overall, the terminal consists of a type of construction kit consisting of a mounting element, a basic element and a head element. The basic element consists of at least one foot element, which has the foot surface as part of its underside. Advantageously, the head element is designed in the manner of a flat cap or flat shell such that, when potting the interior, the transition from the head element to the basic element is already covered with a small volume of potting material and permanently sealed.

This smallest potting volume, which covers the transition when optimally oriented in the potting step, is equal to or less than 50% of the interior volume, advantageously equal to or less than 30% and ideally equal to or less than 25%. The volume of the electrical components is not taken into account here in order to determine the smallest potting volume.

Analogously to the bearing surface and the foot surface, "side," "wall" or "side wall" should not be understood as limiting and may also include the above-mentioned elements in a multi-part form. Furthermore, they may have interruptions or openings, be three-dimensionally contoured and/or have relief-like structures.

A terminal is intended to be understood here as meaning any electrical terminal, in particular a terminal, which serves as a simple sensor or actuator for monitoring or controlling a production or handling system. Terminals are therefore in particular the following devices:

sensors, in particular brightness sensors, (inductive) proximity switches;

actuators, such as simple touch switches, pushers, etc.;

emitters, in particular radiation/light emitters, e.g. as part of a light barrier, sound emitters, e.g. as part of a distance sensor system, or data reception or acquisition devices, such as an NFC receiver, RFID (write) read head, or an IR data receiver.

The electrical terminal, or frequently only called terminal for short, comprises the respective necessary type-related components and modules as electrical components, as already mentioned in part above. The electrical components are ideally held in the head element, e.g. as part of a common carrier plate.

In an exemplary embodiment, the spring element is a leaf spring or spiral spring, a monolithic elastomer or a plurality of elastic fibers.

Here, the spring element is advantageously designed as a tension or compression spring element and correspondingly supported and/or mounted on the rotary bearing unit, the basic element and/or the mounting element at at least one support unit.

If the spring element is designed as a monolithic elastomer, an advantage may be that a flange portion or a thickening, which serves for the suspension or fastening on one side or on a support unit of the rotary bearing unit, is arranged at at least one end. An exemplary embodiment also consists in the fact that the monolithic elastomer is formed as a cylindrical body, for example made from a rubber-elastic material.

In the exemplary embodiment in which a plurality of elastic fibers are provided, it may be advantageous in an analogous manner if at least one end is designed as a thickening and/or is fastened in a flange or carrier body such that they can be suspended or fastened together on at least one side or a support unit of the rotary bearing unit.

In order to fasten the terminal so as to be free of vibration and to reduce noise emissions as well as to avoid an unintentional adjustment of the rotational position, there may be an advantage if the spring element is also pretensioned in the inoperative position of the basic element.

In an exemplary embodiment, it may be provided that the rotary bearing unit comprises at least one lower or upper support unit for the spring element. This transfers the spring force in the adjustment position or under pretension in the direction of force flow to the basic element and/or the mounting body.

An improvement may also consist in that the rotary bearing unit comprises at least two, ideally precisely two opposite support units for the at least one spring element.

Here, advantageously, as described above, at least one support unit or an element of the support unit, such as a contact ring, is rotatable about the axis of rotation. The contact ring provided on one side or on both sides can advantageously be formed from a metal or a very hard plastic, such as an HDPE, acrylic glass or plexiglass.

In an exemplary embodiment, it may be provided that the rotary bearing unit comprises a rotary bearing bolt on which or in which at least one spring element is guided. Ideally, the rotary bearing bolt is part of the mounting body and is enclosed by a rotary bearing portion of the basic element over a partial section. Here, the rotary bearing portion can be displaced parallel along the rotary bearing bolt in the direction of the axis of rotation from the inoperative position into the alignment position.

Advantageously, the rotary bearing portion has an inward facing, flange-like bearing portion and the rotary bearing bolt has a complementary contact edge at the lower end which is not free. In the inoperative position, the bearing portion of the rotary bearing portion is pressed onto the contact edge of the rotary bearing bolt by the spring force or lifted off from it in the adjustment step.

In order to realize a dust- and/or gas-tight closure of the housing interior, a further improvement can consist in that a circumferential sealing element, such as an O-ring, is arranged on the contact edge. Alternatively or additionally, the rotary bearing portion may extend in the direction of the foot of the rotary bearing bolt, wherein a circumferential sealing element is arranged at the lower edge of the rotary bearing portion and/or at the transition from the wall portion supporting the rotary bearing bolt.

An upper support unit is advantageously arranged at the free end of the rotary bearing bolt and can be in particular a screw or a plug and advantageously has a ring portion or flange portion protruding over the rotary bearing bolt. The spring element is clamped between the upper and lower support unit.

A further improvement can consist in that a contact ring, primarily a metal contact ring, is provided at least on one side. Said contact ring can rest, for example, on the flange-like bearing portion of the rotary bearing portion such that, when the basic element is rotated in the adjustment step, it can slide on the contact ring with little friction or the contact ring can be rotated together with the spring element.

In a further exemplary embodiment, a continuous screw is guided in a sleeve-like rotary bearing bolt, wherein the screw head or the locking nut lies on the outside of the base side and/or of a recess there in the wall portion supporting the rotary bearing bolt. The basic structure of the screw, which forms the upper support unit, is analogous in design.

Furthermore, an advantage can consist in that at least one rotary stop is provided to prevent over-rotation of about 360° in order to prevent excessive tension on the inner cable or an inner plug connector. For this purpose, a stop may be formed on the mounting body, in particular in the region of the lower support unit, said stop interacting with a corresponding counterstop or bolt in the basic element. Alternatively, a control cam and an associated sliding block can be provided.

An exemplary embodiment can be provided if the mounting element has, on at least one side wall or side surface and/or inner wall, at least one blocking contour, which, in a form-fitting and/or force-fitting manner in the inoperative position with a blocking mating contour of the basic element, prevents the rotation of the basic element about the axis of rotation.

The locking contour can be a sectional protrusion on one or more edges of the mounting body, said protrusions being designed as small lugs or overhangs. The correlating edge of the basic element has a corresponding phase or a radius. Thus, even in the case that, in the inoperative position, the rear side of the basic element does not lie against the inside of the mounting body, the alignment position counter to the direction of force of the spring element has first to be produced before the basic element can be rotated about the axis of rotation.

Alternatively or additionally, a groove or step edge can be arranged on one side and a spring or mating edge, which for example is complementary to a substantially continuous side wall, can be arranged lying opposite as a corresponding (correlating) mating contour.

In an exemplary embodiment, the bearing surface and the foot surface have, at least in sections, a curved, wavy profile, which are complementary to one another, and/or have other positive locking geometries as a blocking contour, which are complementary to one another and have to be overcome in the axial direction to reach the adjustment position, before the basic element can be rotated relative to the mounting element. Alternatively or in addition, a blocking contour can also be realized in separate tongue and groove elements, pin-receiving elements or in another way, which in each case prevent the direct rotation in the inoperative position, without axial spacing of the bearing surface and foot surface.

In an embodiment, the bearing surface has an outer, circumferential elevation, wherein correlating to this, the foot surface and/or the side surface of the basic element have/has at least one recess. In the inoperative position, the elevation and the recess are combined to form a continuous side surface, which is in particular substantially continuous. The elevation thus forms a blocking contour, which has to be overcome before the rotation in the axial direction. In an alternative exemplary embodiment, the elevation is provided only in sections and/or on the side of the basic element and the recesses are arranged in an analogous manner on the mounting element or the mounting body.

In an exemplary embodiment, it may be provided that the mounting body has a first opening for the passage of a cable from a plug connector arranged on the connection side to the basic element. Alternatively or in addition, a further improvement can consist in that the mounting body has a further opening in which the plug connector and/or an adapter body for a plug connector can be received and fixed. Ideally, the first opening and the further opening merge into each other.

Advantageously, an intermediate space, in which a portion of the cable leading from the plug connector to the electrical component can be received, is formed on the rear side of the connection side between the basic element and the mounting body. The first and second (further) openings ideally lead from the connection side into said intermediate space. Advantageously, the intermediate space is formed by at least one offset in the housing portion of the basic element and/or the mounting body.

Advantageously, the second opening in the mounting body is designed as a pipe socket or a sleeve portion, which projects over the mounting body in the direction of the main axis. It can have a latching or coupling element into which a plug connector or an adapter body for a plug connector can be latched or coupled.

Advantageously, the pipe socket or the sleeve portion is formed monolithically with the mounting body.

Here, the first, inner opening, which only has to receive or provide passage for the cable, can have a smaller diameter than the second, outer opening in which the adapter body or the plug connector is held. Alternatively, a single, continuous opening with only a single diameter can also be provided.

The outer, second opening can be improved in such a way that it has a (inner) thread or a bayonet lock, in particular for fastening a plug adapter, plug connector or parts thereof. Furthermore, this second opening in the mounting body, which is designed as a pipe socket or a sleeve portion, can itself be formed as a side of a plug connector.

In a further exemplary embodiment, it can be provided that the basic element and the head element are connected or are connectable to each other, wherein the basic element comprises at least one coupling element, on which a correlating (mating) coupling element of the head element is connectable in a form-fitting and/or force-fitting manner.

The coupling elements can in particular be hooks, clips, a latching connection which can be closed without tools after the two parts have been fitted and, if necessary, interlock with each other such that they can only be opened or separated by being destroyed, even if no potting material, which subsequently cures, is introduced into this region.

Alternatively, a screw connection or other releasable connection can be provided.

Advantageously, the head element forms the closure on the end side here. The head element provides the primary functional space for the electrical and electrical components, which are not limited thereto and can project into the entire interior.

In another, alternative exemplary embodiment, the head element is provided with an inner partition, with one or more cables being connected for communication and/or power supply.

In a further improvement of this exemplary embodiment, it can be provided that a sealing element, in particular a circumferential sealing element, is arranged at the transition to the head element.

The circumferential sealing element is designed in particular as a double ring seal, on both sides in a groove which is arranged both in the top edge of the basic element and in the top edge of the head element.

To complete the terminal as a modular system in which different types of terminals can be inserted into identical or substantially identical basic and head elements or can be formed therefrom, it is advantageous if the electrical components are held completely in the head element. For this purpose, the head element can have clip elements or latching elements, in particular can have clip elements or latching elements on two opposite sides, into which a carrier plate for the electrical components can be inserted and clamped.

The basic element is advantageously not used for fastening electrical components or a carrier plate. Only a cable for the connection of a data-conducting or current-conducting connection and/or an inner plug connector necessary for this purpose is arranged in the basic element in such an exemplary embodiment.

For displaying operating states and/or for other warning and/or signal output, it is advantageous if the head element has one or more LEDs. The LEDs are ideally arranged in the corners of the head element. Even if the LEDs in the electrical terminal are ideally arranged in the corners of the head element, an exemplary embodiment variant consists in providing at least one LED in one corner of the basic element, in particular one LED in each of a plurality of corners of the basic element. Furthermore, it can be provided that at least one LED is integrated in the plug itself, for example for displaying the operating states.

If the edge concerned serves as a mating edge for a blocking mating contour to a blocking contour, it is advantageous if the LED is inserted in an analogous blocking mating contour or is formed as such. Overall, it is advantageous if at least two LEDs which can emit different colors are provided. In the case of four LEDs, for example, two red or yellow LEDs and two green LEDs are provided.

In a further exemplary embodiment, the basic element has at least one potting opening. It is particularly advantageous if the at least one potting opening is arranged on one of the rear sides which is opposite the end face in the linear or basic alignment. This has the advantage that for potting purposes the terminal can be aligned vertically downward on the end face and the potting material primarily fills the head element, the electrical components there and the transition seam or seal from the head element to the basic element. The filling of the interior in regions in which no electrical components are arranged can be minimized or even completely avoided.

The potting is advantageously carried out only up to such a level that the spring element remains completely or substantially free of potting material, in order not to eliminate the possibility of adjustment from a first inoperative position into an adjustment position and from there into a second inoperative position.

In particular, if it is intended that the basic element be filled completely with a potting material, it may be advantageous for a tubular or cylindrical protective cap to be arranged over the free end of the rotary bearing unit. Such a protective cap has a closed end and an open end and allows the basic element to be completely potted, wherein the spring element and thus the spring mechanism is kept potting-free.

Advantageously, the edge of the open end of the protective cap sits sealing on the foot element and/or the rotary bearing portion of the basic element. In an exemplary embodiment, the protective cap with the edge at the open end is glued or welded on. Alternatively or in addition, the protective cap is fastened in a force-fitting and/or form-fitting manner in the region of the foot element and/or the rotary bearing portion, wherein suitable sealing elements can be provided as required. The abovementioned attachment of the protective cap is advantageously carried out before the potting step of the basic element.

Ideally, two potting openings are provided, one for filling and one for venting. After potting, the potting openings can be closed, in particular permanently closed. This can be done by plugging, adhesive bonding, welding, or any other suitable means or process.

The terminal can be further improved in that an engagement area designed as a local offset is provided. This is advantageously provided in the region of the side surfaces, which are in particular vertical to the connection side of the mounting element. In order to be able to lift the basic element from the mounting body, the engagement area advantageously extends over the region of the side surface of the basic element and the mounting body.

The disclosure also relates to a production method for an electrical terminal, which comprises the following steps:

connecting a mounting element to a basic element on a common rotary bearing unit comprising an axis of rotation, wherein the rotary bearing unit furthermore comprises a spring unit, and/or a spring unit is connectable thereto, and wherein in a subsequent step, the spring unit is tensioned along the axis of rotation in such a way that the basic element is pressed onto the mounting element or its mounting body and/or is pressed onto the mounting element as soon as the basic element is lifted or pulled off from the mounting element in the axial direction.

In these steps, it is advantageous if the head element is not yet connected to the basic element or only the inner cable or an inner plug connector is connected to the head element.

This method can be improved in that the head element is subsequently applied to the basic element, in particular is pressed on. Advantageously, the head element is applied without tools, e.g. clipped on or latched into place. "Without tools" here does not mean a transport or gripping means with which the head element and/or the basic element are gripped, fed to each other and pushed together, as a replacement and automation of a production step that in principle can be carried out purely manually.

Before attaching the head element without tools, the inner cable coming from the (outer) plug connector is soldered to a strip conductor of the carrier element or a corresponding inner plug connector is joined together.

In an improved method variant, the interior of the head element is filled at least partially with potting material. For this purpose, it may be advantageous to align the electrical terminal vertically such that the head element and/or the end face of the head element faces vertically downward and subsequently that the head element is filled with potting material through at least one (potting) opening in the basic element.

Advantageously, a second opening is provided through which the air can escape from the interior when filling with potting material. The common interior of the basic element interior and the head element interior is advantageously filled at least in the circumference and then cured until all the electrical components are covered and also the transition between the basic element and head element and a seal there are covered.

Overall, it is advantageous if an electrical terminal according to one of the variants and exemplary embodiments mentioned herein is produced by means of the production method.

Furthermore, the disclosure also comprises a method for adjusting an electrical terminal, the electrical terminal comprising a basic element and a mounting element, which are in mutual contact with each other in partial areas, and, in an adjustment step, the basic element being brought from an inoperative position in a linear alignment into a second inoperative position in a corner alignment, and vice versa. The adjustment method here comprises the following steps:

the basic element is lifted off the mounting element from the first inoperative position in the direction of an axis of rotation by a distance counter to an applied spring force, the basic element is rotated by an angular degree about the axis of rotation corresponding to the alignment of the second inoperative position in the direction of rotation, the basic element is guided back in the direction of the spring force and parallel to the axis of rotation and brought into contact with the mounting element.

In a method variant here, the basic element is lifted off the mounting element by the distance in the direction of the axis of rotation counter to the spring force, which distance is equal to or greater than the extent of an existing blocking contour of the basic element and/or the mounting element.

Advantageously, the method is improved in that the electrical terminal is designed according to one of the variants and exemplary embodiments mentioned herein.

It should also be noted that, within the scope of the present patent application, indefinite articles and indefinite numerical indications such as "one . . . ," "two . . . ," etc. should generally be understood as minimum indications, i.e. as "at least one . . . ," "at least two . . . ," etc., unless it is apparent, for example, from the context or the concrete text of a particular passage that only "exactly one . . . ," "exactly two . . . ," etc., is intended to be meant there.

At this juncture it should also be mentioned that, in the context of the present patent application, the expression "in particular" should always be understood to mean that an optional, preferred feature is introduced with this expression. The expression should not be understood as "and specifically" nor as "namely".

The great advantage of this solution is that intuitive operation for changing the position and alignment of the (active) end face of the terminal without tools is possible. A very high degree of flexibility can be achieved by means of fewer mechanical parts. In addition, no separate holder, bearing plates or other loose parts are required.

BRIEF DESCRIPTION OF THE DRAWINGS

Further details and advantages of the disclosure will now be explained in more detail with reference to an exemplary embodiment illustrated in the drawings, in which.

DESCRIPTION OF EXEMPLARY EMBODIMENTS

Figure 1:
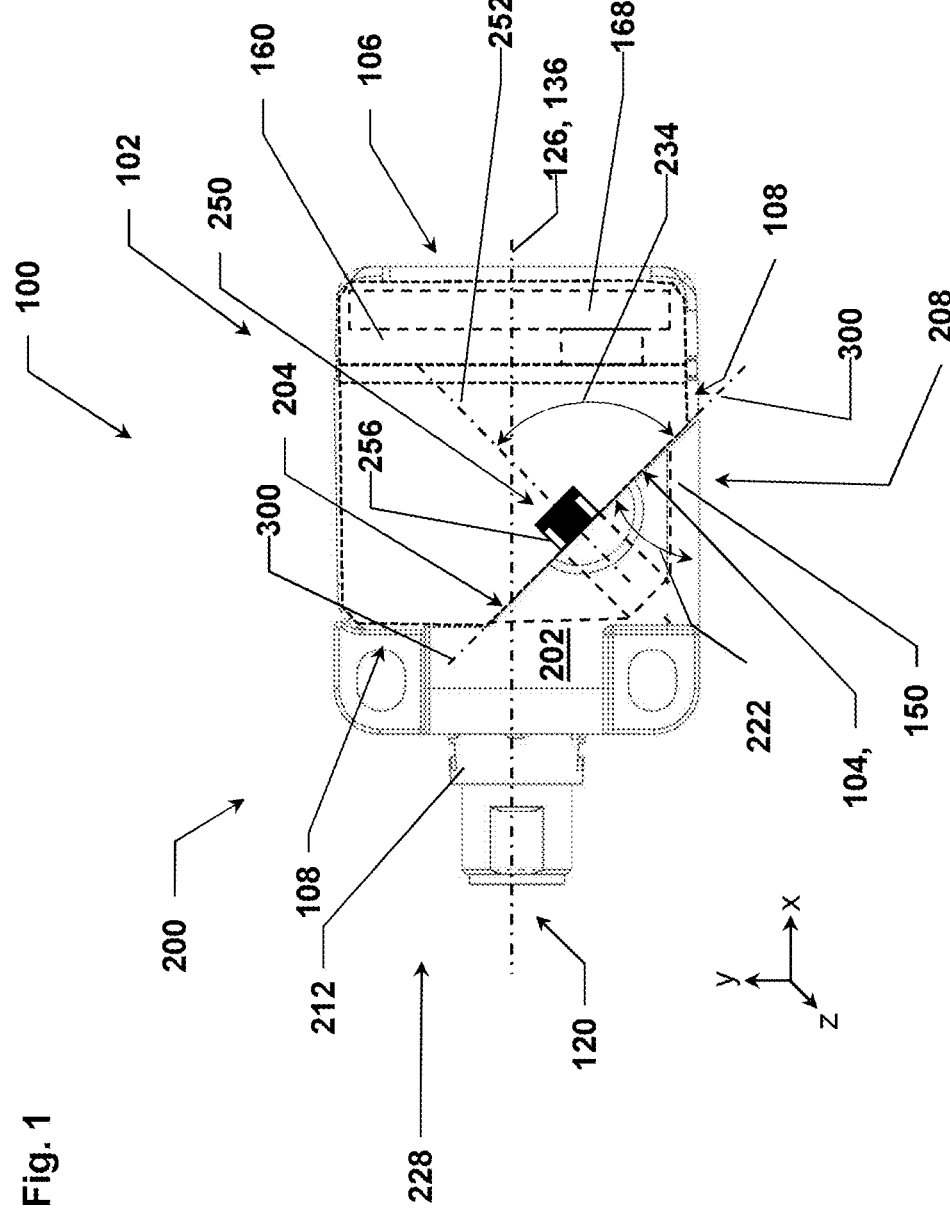
FIG. 1 shows an exemplary embodiment as a sectional illustration of the electrical terminal in the longitudinal or basic alignment.

FIG. 1 shows a schematic construction of a terminal 100, which has a mounting element 200, a housing 102 with a basic element 150 and a head element 160 and here is an inductive proximity sensor.

The electrical terminal 100 is shown in the linear or basic alignment in which the plug axis 126 is congruent with the main axis 136, wherein the main axis 136 runs parallel to the x-axis, as has been indicated with the small Cartesian coordinate system. An electrical component 168, which has been indicated as a dashed line is arranged in the head element 160. The mounting element 200 comprises a mounting body 202, a guide element 212, a plug connector 120 and a bearing surface 204, with further details being shown and explained below in FIG. 2. The basic element 150 has two rear sides 108, one of which forms a common underside with the base side 208 of the mounting body 202.

The bearing surface 204 of the mounting body 202 forms a common contact plane 300 with the foot surface 104 of the basic element 150, which contact plane is perpendicular to the image plane and is represented as a chain-dotted line. The angle of inclination 222 of the contact plane 300 and thus also the bearing surface 204 and the foot surface 104 is 45°, as shown with respect to the base side 208 and the main axis 136 or the plug axis 126.

Furthermore, a rotary bearing unit 250 is included, the axis of rotation 252 of which is perpendicular to the contact plane 300, as shown by the angle 234. The rotary bearing unit 250 has a spring element 256, which is illustrated in detail in particular in FIG. 3. The side surfaces 206 of the mounting element 202 and the cover parts 110 of the basic element 150 are parallel to the image plane and the x-y plane and are not shown in FIG. 1.

The housing 102 consisting of the basic element 150 and the head element 160 is substantially in the shape of a cube with the edge length dimensions of 40×40×40 mm. The aforementioned edge length is very advantageous in automation technology, with the edge lengths not being limited thereto and being able to be in the range of 10×10×10 mm to 100×100×100 mm, for example.

Figure 2:
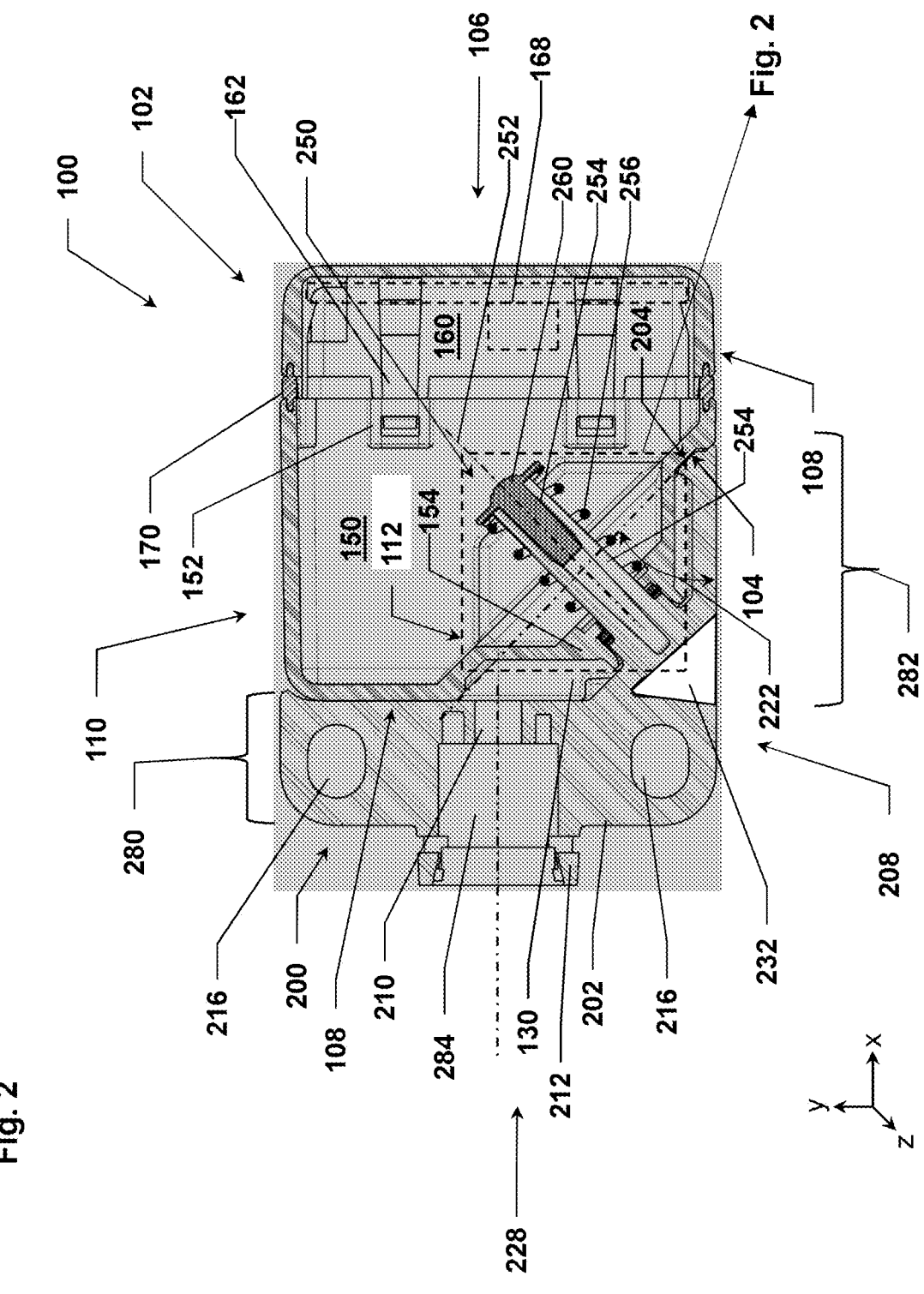
FIG. 2 shows the exemplary embodiment according to FIG. 1 as a further sectional illustration.

As can be seen with more details in the sectional illustration of FIG. 2, the mounting body 202 has a rear wall 280 with the outer connection side 228 and a basic portion 282 with the base side 208. The rear wall 280 and the basic portion 282 are substantially perpendicular to each other. In the rear wall 280, a guide element 212 is arranged on the connection side 228, the guide element merging into an opening 284 and/or comprising the opening 284, which is provided for receiving an adapter body or plug connector (not illustrated). This outer (second) opening 284 merges into an inner (first) opening 210 with a smaller diameter and leads into an intermediate space 130, which lies between the mounting body 202 and the basic element 150 or an offset in the foot element 112 or the rotary bearing portion 154.

Furthermore, two fastening elements 216 are included, which are designed as two parallel through holes. The pair of two further fastening elements 218 perpendicular thereto is illustrated, for example, in FIG. 4.

A circumferential double ring seal 170 is arranged at the transition from the basic element 150 to the head element 160. The basic element 150 and the head element 160 each have a group of coupling elements 152, 162. The coupling element 162 of the head element 160 is designed as a latching hook and the coupling element 152 of the basic element 150 is designed as an associated eye or latching edge. The two complementary coupling elements 152, 162 are illustrated in the connected state. In the example shown, in each case two complementary coupling elements 152, 162 are arranged on each side.

The contact plane 300 (not shown) is formed from the foot surface 104 and the bearing surface 204 resting thereon. The foot surface 104 is part of the foot element 112, which together with the top part 110, illustrated above, the two rear sides 108 and the two side parts 114 form the housing of the basic element 150. The side parts 114 are perpendicular to the rear sides 108 and the cover side 110 is perpendicular to a rear side 108 and is parallel to the other rear side 108.

The foot element 112 has the foot surface 104 on the underside in partial regions and furthermore comprises the rotary bearing portion 154. The rotary bearing unit 250 comprises a rotary bearing bolt 254, which is formed as part of the mounting body 202. At the foot end of the rotary bearing bolt 254, a recess 232 is formed in the base side 208 of the mounting body 202. The bearing surface 204 and the foot surface 104 are inclined by the angle of inclination 222 relative to the base side 208 and the axis of rotation 252 is perpendicular thereto and also forms the longitudinal axis of the rotary bearing bolt 254. On the outside of the rotary bearing bolt 254, a spiral spring is arranged as a spring element 256, which acts as a compression spring via the upper support unit 260 of the rotary bearing bolt 254 on the rotary bearing portion 154 of the foot element 112 and on the lower support unit 258 there.

Figure 3:
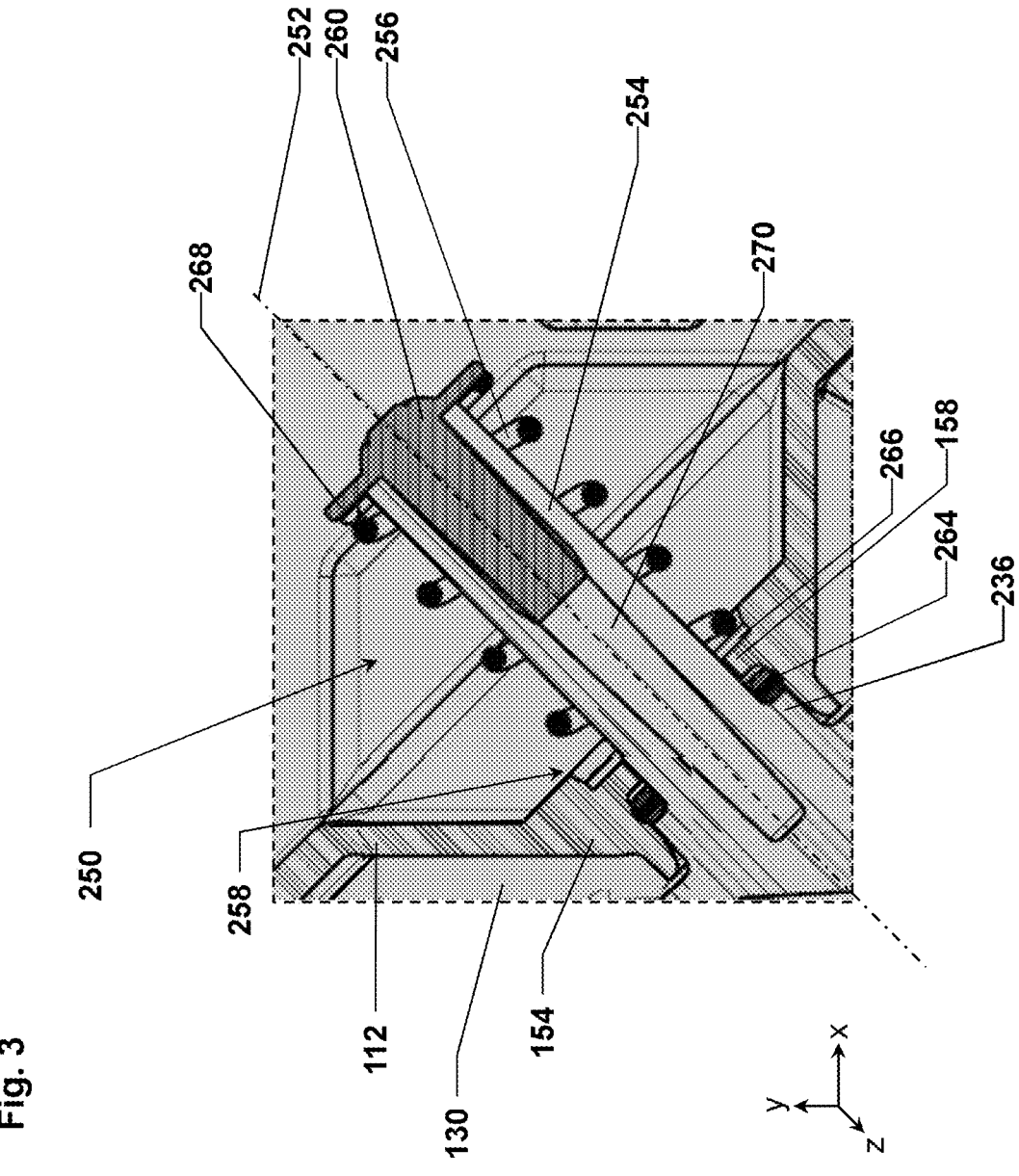
FIG. 3 shows the rotary bearing unit of FIG. 1 in an enlarged detailed illustration.

The detailed illustration of FIG. 3 shows the rotary bearing unit 250 of FIG. 1. The foot element 112 merges in the central region into the rotary bearing portion 154, which encloses the rotary bearing bolt 254. The rotary bearing portion 154 has a flange-like bearing portion 158, which faces in the direction of the axis of rotation 252. A metallic bearing ring 266 on which the spring element 256 designed as a spiral spring stands with its lower end and can slide is arranged on the top side. A support unit 260 which is designed as a screw with an outer flange portion 268 is arranged in the free end of the rotary bearing bolt 254. The spring element 256 lies with its outer end against the flange portion 268. The rotary bearing bolt 254 has an interior 270 and an internal thread into which the screw-like support unit 260 is screwed. The spring element 256 has been compressed by the screwing-in of the upper support unit 260 and thus causes a constant pretension on the bearing portion 158 of the foot element 112.

A circumferential bearing edge 236 on which the sealing element 264 in the form of an O-ring is arranged is formed at the foot end of the rotary bearing bolt 254. The pretensioning of the spring element 256 causes the sealing element 264 to be pressed in in the inoperative position between the circumferential bearing portion 158 and the likewise circumferential bearing edge 236 and the interior of the basic element to thus be sealed. In order to change the rotational position of the basic element 150, the bearing portion 158 is lifted off the sealing element 264, counter to the effective spring force, which is increased in the process. When there is sufficient spacing in the axial direction away from the inoperative position (adjustment position), the basic element 150 can be pivoted about the axis of rotation.

Figure 4:
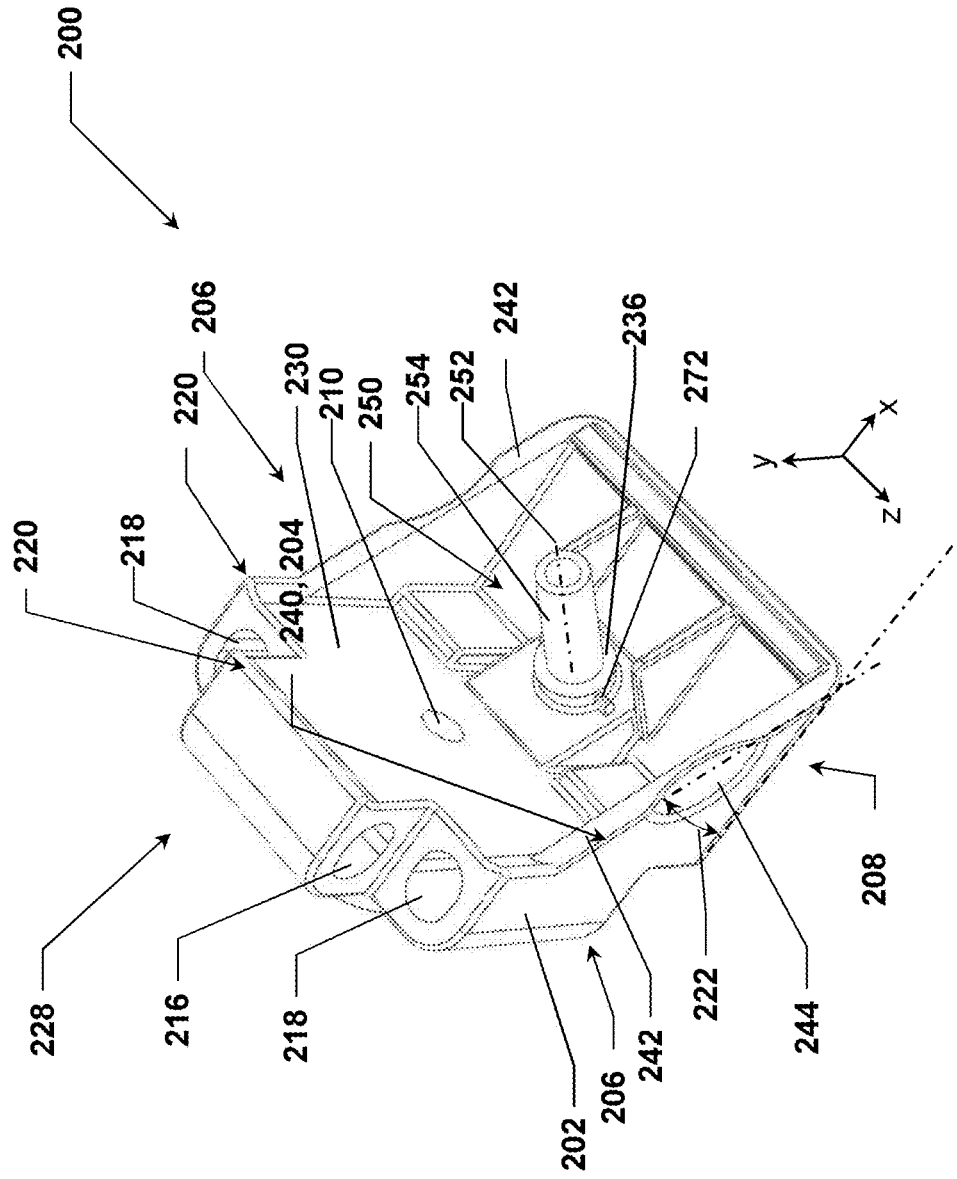
FIG. 4 shows the mounting element of the terminal according to FIG. 1 in a perspective illustration.
Figure 6:
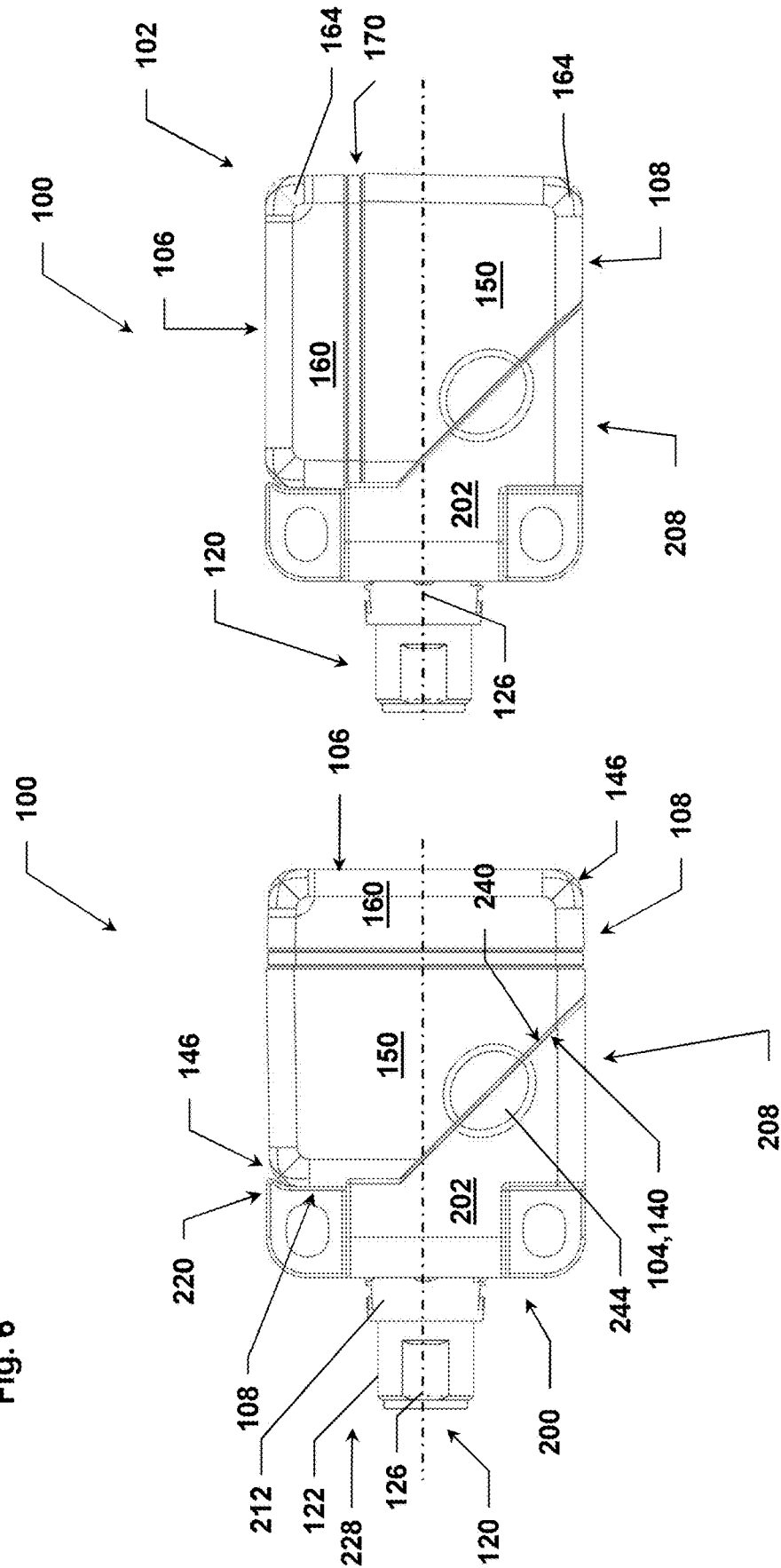
FIG. 6 shows the terminal according to FIG. 1 in two partial illustrations each with an alignment in perspective illustrations.

The exposed mounting body 202 is shown in FIG. 4. The mounting body 202 has, on the rear portion, the already mentioned two pairs of parallel fastening elements 216, 218, which are perpendicular to each other and the axes of which span a common plane. In the exemplary embodiment shown, the bearing surface 204 is spanned by the inclined bearing edges 240 of the side surfaces 206 and the base side 208. A protrusion 242 is formed parallel to the bearing edge 240. FIG. 6 indicates the complementary bearing edge 140 of the basic element 202.

The mounting body 202 has, on the rear portion on the inside at the edges, blocking contours 220, which are designed as protruding edges and protrude in the direction of the edges (not illustrated) of the rear side 108 of the basic element 150. As can readily be seen in particular in FIG. 7, in each case one of the blocking contours 220 runs parallel to an adjacent edge of the rear side 108.

For receiving a fastening means (not illustrated) and to avoid covering the optionally adjacent LED, the rear wall 280 of the mounting body 202 is cut out at the two upper corners and at the transition to the base portion 282 such that a screw head does not protrude over or conceal the housing and/or an LED there.

Furthermore, FIG. 4 shows, in the region of the lower support unit 258, a rotary stop 272 which interacts with a corresponding stop element, which is arranged on the basic element, and prevents excessive rotation and damage to the cable 132.

Furthermore, FIG. 4 shows a stiffening element provided for strength reasons in order to realize a lightweight and material-saving design.

Figure 5:
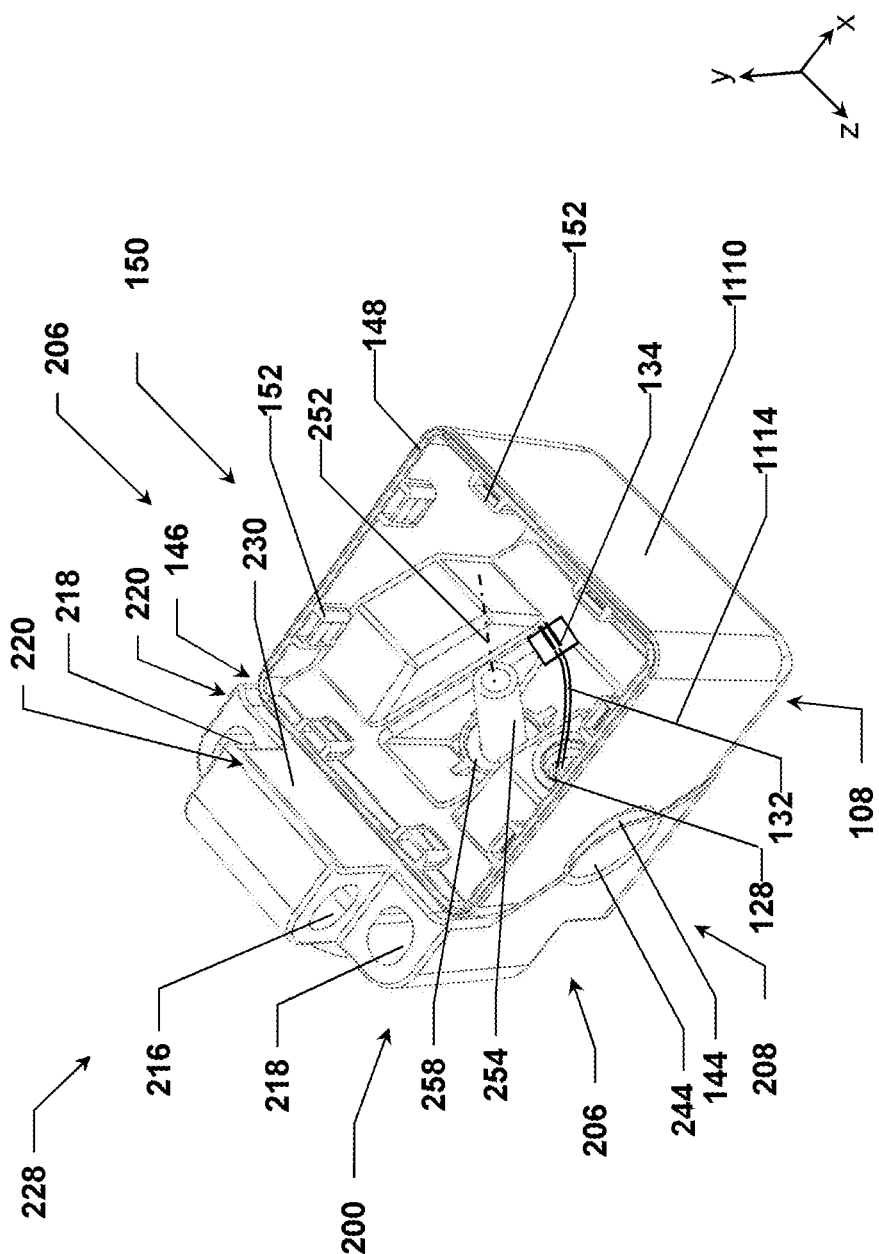
FIG. 5 shows the mounting element according to FIG. 4, supplemented with a basic element of the terminal in a perspective illustration.

FIG. 5 illustrates the mounting element 202 according to FIG. 4 together with a basic element 150 without the head element 150. In addition to the elements already described, the basic element 150 has an offset in which a feedthrough 128 is arranged, through which the cable 132 is guided. In the example shown, an inner plug connector 134 is already fastened to the cable 132, wherein said cables 132 or cores thereof can be soldered directly to the electrical component. The feedthrough 128 is an opening which may have a seal for the fluid-tight encasing of the cable 132. The seal may be designed, for example, as a membrane seal or a rubber strand.

The aforementioned intermediate space between the mounting body 202 and the basic element 150, into which the opening 210 leads and in which the cable 132 is passed through, is formed behind the offsets.

A first part of the engagement area 244 is arranged on the side of the mounting body 202, and the second part of the engagement area 144 is arranged on the basic element 150. These result together in an oval engagement area.

Furthermore, the coupling elements 152 formed as eyes for connection to the complementary coupling elements 162 of the head element 160 are highly visible. The circumferential top edge 148 has a likewise circumferential groove for a sealing element 170.

At the edges of the mounting element 202, protruding blocking contours 220 are formed in the region of the rear side 108 of the basic element 202 adjacent to the inner wall 230. Said blocking contours protrude over the edges 146, which snap back and thus form the blocking mating contour. Random twisting of the basic element 150 in the inoperative position is thus reliably prevented. Furthermore, it can be seen that a part of this one rear side 108 is formed by the head element 160 which is not yet mounted.

FIG. 6 illustrates the electrical terminal in two partial illustrations, each with an alignment in perspective illustrations and in the fully mounted, but not fastened alignment. The left partial illustration here shows the linear alignment or basic alignment of the terminal 100 and the right partial illustration shows the corner alignment, in which the basic element 150 has been rotated with the head element 160 by 180° about the axis of rotation from the first inoperative position such that the second inoperative position has been reached. In this second inoperative position, the head element 160 and in particular the head side 106 is aligned parallel to the plug axis 126 or is perpendicular to the inner wall 230.

An adapter body 122 which serves to receive the actual plug connector for the external connection is arranged in the guide element 212. The head element 150 has an LED 164 at each corner.

Figure 7:
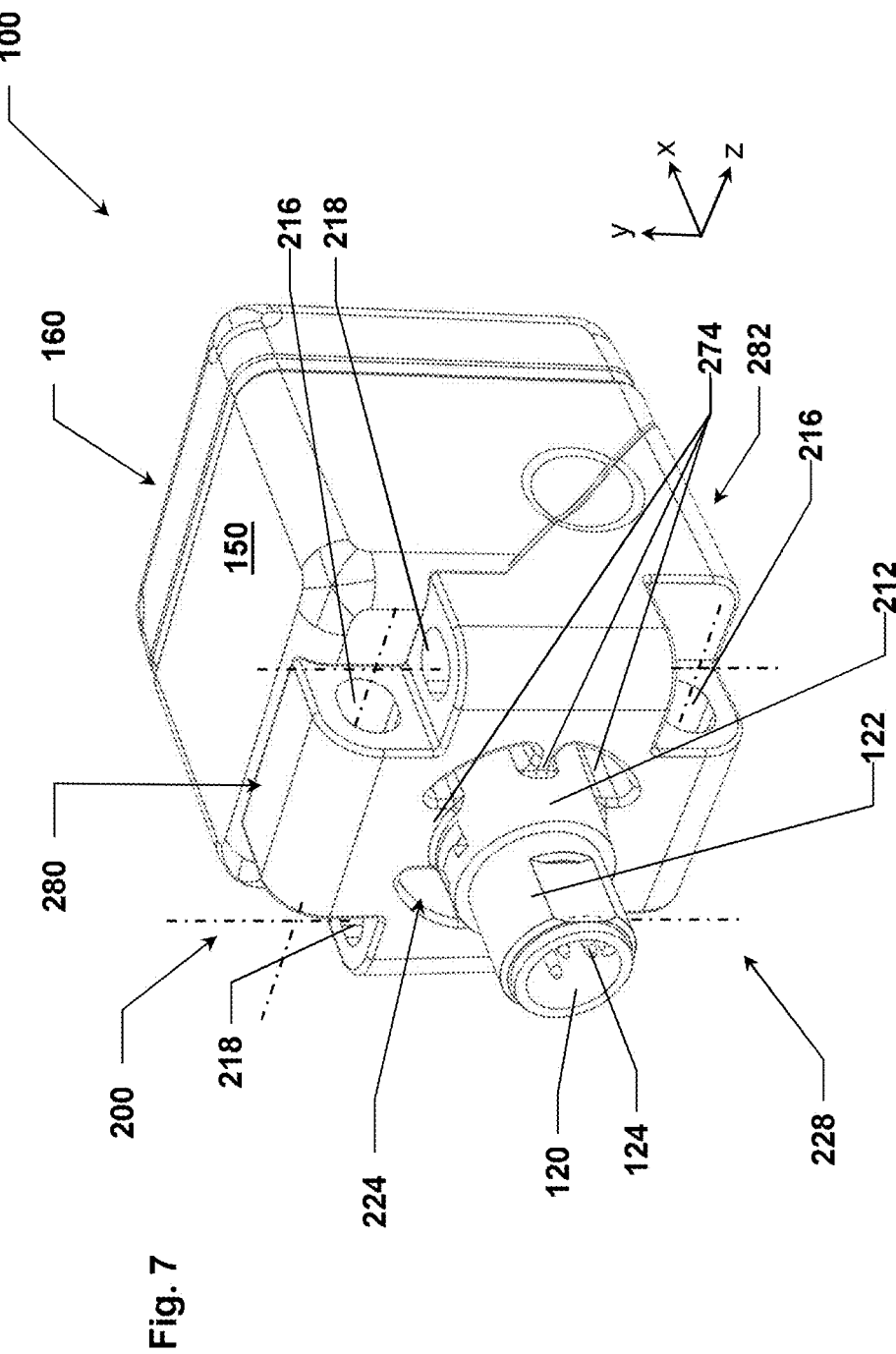
FIG. 7 shows the terminal in a further exemplary embodiment from the viewing direction onto the connection side in a perspective illustration.

FIG. 7 illustrates the terminal in a longitudinal alignment from the viewing direction onto the connection side 228. On the rear side, the mounting element 202 has openings 224, which are interrupted by webs 274. The webs 274 merge into the guide element 212 in which the adapter body 122 for the plug connector 120 is arranged, of which three contact pins 124 are shown. The adapter body 122 is latched into the guide element 212 in a manner not illustrated specifically via two latching elements. The opening formed by the guide element 212 is continued through the inner wall 230 and into the intermediate space 130.

The openings 224 are not continuous here and are closed by the inner wall 230 toward the basic element 150.

Figure 8:
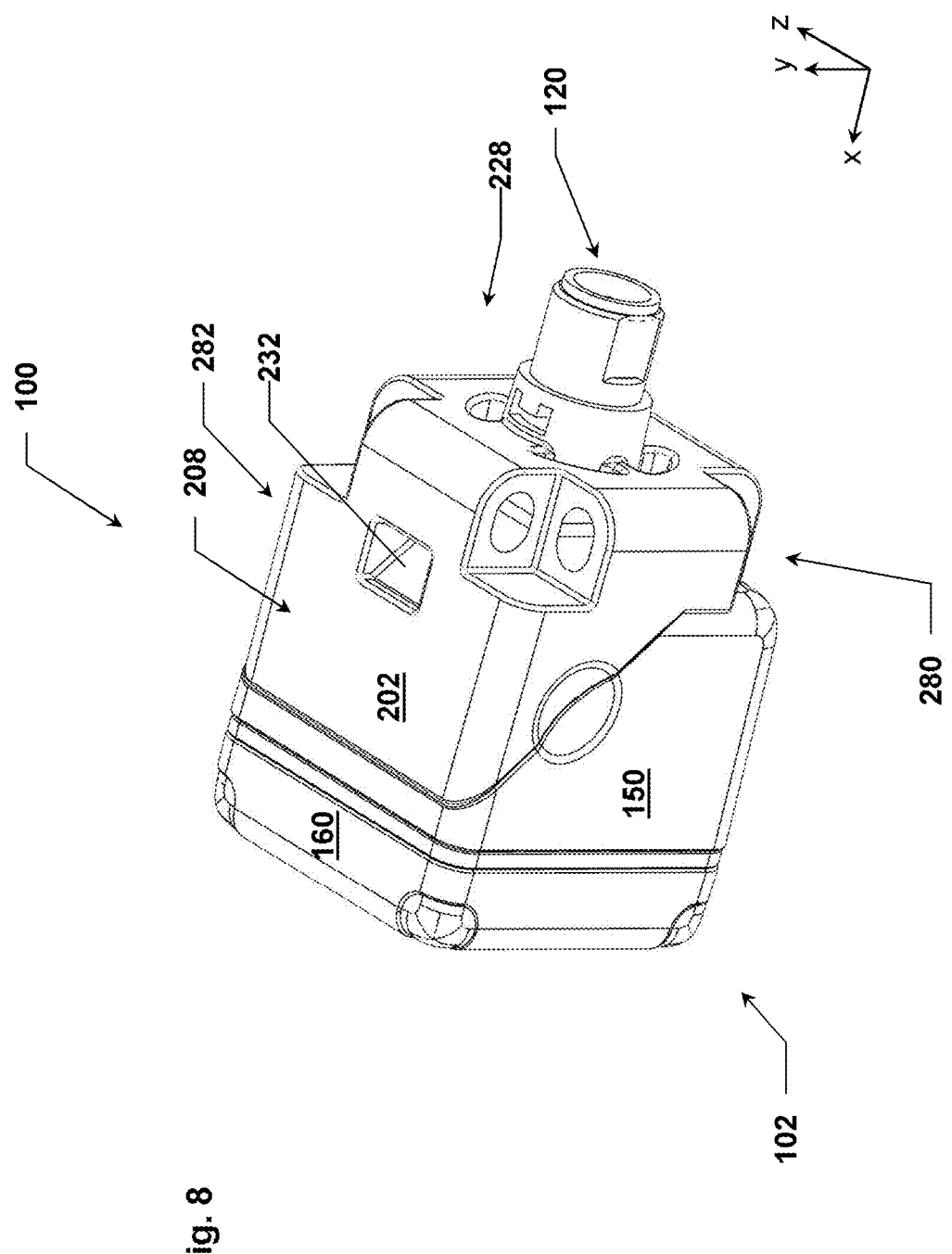
FIG. 8 shows the terminal in a further exemplary embodiment from the viewing direction onto the base side in perspective illustration.

FIG. 8 also shows the terminal 100 in a longitudinal alignment looking onto the base side 208. A recess 232 is arranged on the base side 208, analogously to the recess shown in FIG. 2. In this case, the wall portion running obliquely inward forms the wall portion on which the rotary bearing bolt 254 is at least partially supported. In an exemplary embodiment which is not illustrated, a bore is provided in this wall portion, and therefore a screw from there or arriving there is guided through a sleeve-like rotary bearing bolt 254 and thus a spring element can be held and pretensioned as required.

Figure 9:
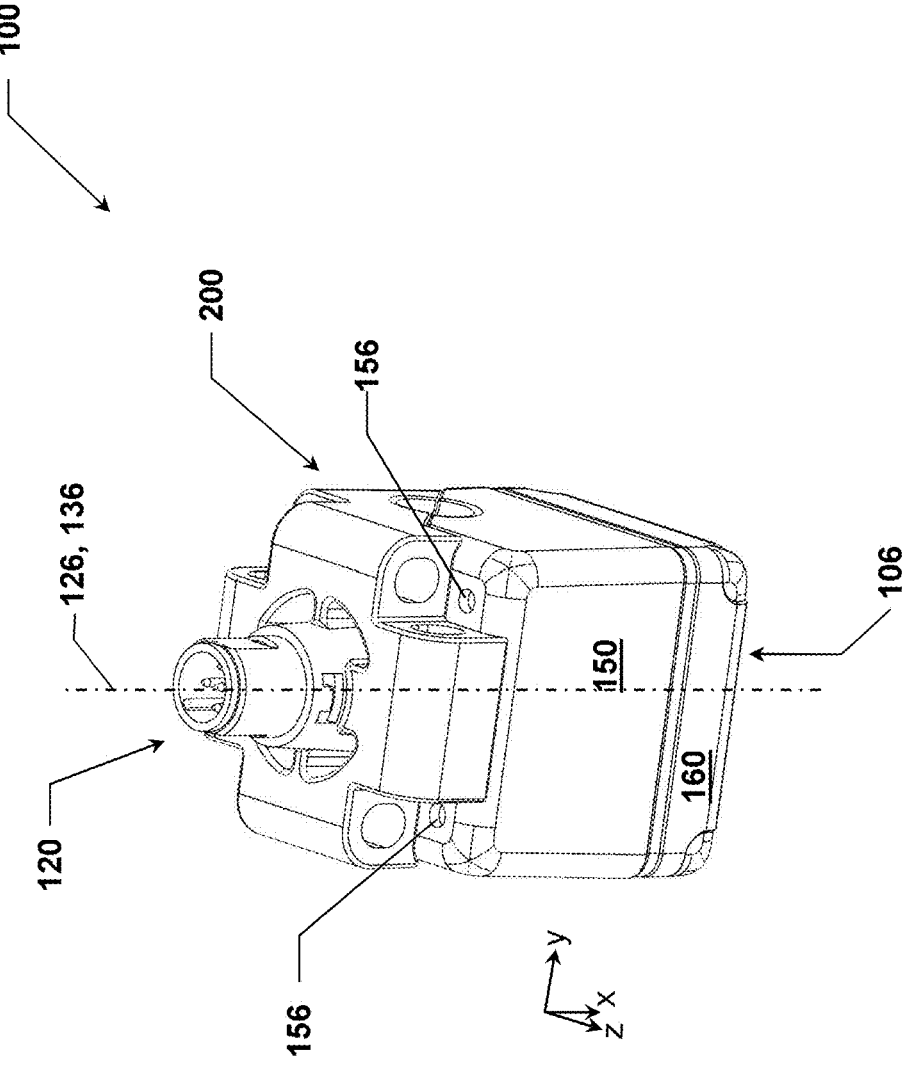
FIG. 9 shows the terminal in a further exemplary embodiment of the vertical alignment relevant for the potting as a perspective illustration.

The illustration of FIG. 9 shows the terminal 100, which has two openings 156 in the region of the rear side 108. These openings 156 are arranged in the longitudinal alignment of the terminal 100 such that they lie in the region of the recesses on the rear side of the mounting element 202. They are therefore open and accessible for the insertion of potting material from the outside.

The terminal 100 is shown in FIG. 9 for the potting step in the preferred alignment, in which the head element 160 is aligned with its end face 106 vertically downward. Potting material is filled through one of the two openings 156, with it being possible at the same time for air or gas to escape from the interior of the housing 102 via the second opening 156. The potting material, not illustrated, is filled into the interior to an extent such that the electrical component 168 and the transition between the head element and the basic element are covered and/or until the feedthrough 128 for the cable 132 and a seal there is covered.

Figure 10:
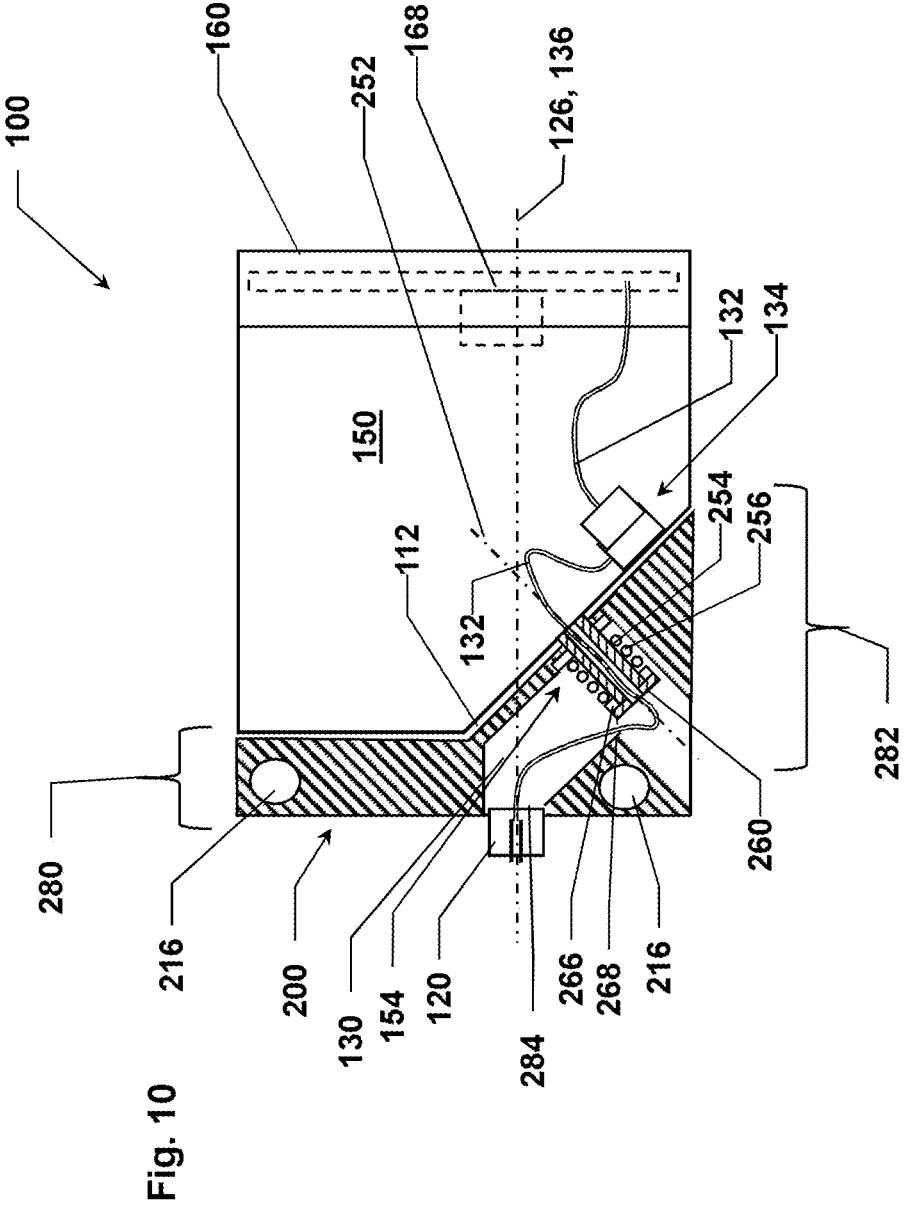
FIG. 10 shows the terminal in a further exemplary embodiment as a sectional illustration in a sketched illustration.

FIG. 10 shows an alternative embodiment, which likewise comprises a mounting element 200, a basic element 150 and a head element 160.

In this case, the mounting body 202 has a rotary bearing portion 154 and a rotary bearing bolt 254 is formed on the basic element 150 as part of the foot element 112 or the foot side. The upper support unit 260 with a laterally projecting flange portion 268 is arranged at the free end of the rotary bearing bolt 254 and can be reached via the opening or recess 232 in the base side 208 of the mounting body 202. The flange portion 268 serves as a first stop for the spring element 256 at the one end and an opposite bearing portion as an element on the mounting body 202 serves as a second stop, and therefore the spring element 256 likewise acts as a compression spring.

In an exemplary embodiment which is not illustrated, the cable 132 is not centrally guided through the rotary bearing unit 250, as illustrated, but rather is introduced laterally into the basic element 150 analogously to the previous exemplary embodiments. In particular in this exemplary embodiment, the rotary bearing bolt 254 can be completely tightly closed at its free end. Furthermore, the cable 132 can be soldered directly in the region of the head element 160 without inner plug connectors.

All in all, the reference signs above always have the same meaning and, in order to avoid repetitions or for the sake of brevity, are mentioned only when they appear for the first time or are essential for understanding the respective figure. Furthermore, the individual features of the exemplary embodiments can be combined or interchanged as required, unless compelling reasons indicate otherwise.

LIST OF REFERENCE SIGNS

100 terminal, electrical
102 housing
104 foot surface
106 end face
108 rear side
110 cover part
112 foot element
114 side part
120 plug connector
122 adapter body
124 contact pins
126 plug axis
128 feedthrough
130 intermediate space
132 cable
134 plug connector, inner
136 main axis
140 bearing edge
144 engagement area
146 edge, blocking mating contour
148 top edge
150 basic element
152 coupling element
154 rotary bearing portion
156 opening
158 bearing portion
160 head element
162 coupling element
164 LED
168 component, electrical
170 sealing element
200 mounting element
202 mounting body
204 bearing surface
206 side/contact area
208 base side
210 opening
212 guide element
216 fastening element
218 fastening element
220 blocking contour
222 angle of inclination of the bearing surface
224 opening
228 connection side
230 inner wall
232 recess
234 angle
236 bearing edge
240 bearing edge
242 protrusion
244 engagement area
250 rotary bearing unit
252 axis of rotation
254 rotary bearing bolt
256 spring element
258 support unit, lower
260 support unit, upper
264 sealing element
266 bearing ring
268 flange portion
270 interior
272 rotary stop
274 web
280 rear wall
282 base portion
284 opening, outer
300 contact plane

The invention claimed is:
1. An electrical terminal comprising:
a multi-sided housing with a basic element, the basic element having at least two rear sides, and a head element, the head element being configured as a detection and/or functional element and including a detection and/or functional side; and a mounting element having a mounting body with at least two side surfaces, a base side and an inner wall, and two rear sides, the mounting element and/or the mounting body being connected to the basic element via a rotary bearing unit, which has an axis of rotation, the basic element being pivotable about the axis of rotation in an adjustment position, and i) the basic element having a single- or multi-part foot surface, and ii) the mounting element and/or the mounting body having a single- or multi-part bearing surface, the foot surface of the basic element and the bearing surface lying against each other at least with a partial area in an inoperative position of the basic element, and the at least one partial area spanning a theoretical contact plane, which is inclined in relation to the detection and/or functional side and/or a rear side by an angle of inclination, and the axis of rotation being aligned perpendicularly to the theoretical contact plane, the bearing surface and/or the foot surface, wherein the basic element is liftable from the mounting element out of the inoperative position along the direction of the axis of rotation, thereby being brought into the adjustment position, wherein the foot surface of the basic element is spaced apart from the bearing surface of the mounting body in the adjustment position, and wherein the rotary bearing unit includes a spring element, the spring element being formed and mounted such that, in the adjustment position, a restoring spring force exerted by the spring element acts on the foot surface of the basic element in the direction of the bearing surface and/or the contact plane.

2. The electrical terminal as claimed in claim 1, wherein the electrical terminal is a sensor, an emitter, or a data acquisition device.

3. The electrical terminal as claimed in claim 1, wherein the spring element is a spring, a monolithic elastomer, or a plurality of elastic fibers.

4. The electrical terminal as claimed in claim 1, wherein the rotary bearing unit comprises at least one (lower) support unit for the spring element.

5. The electrical terminal as claimed in claim 4, wherein the rotary bearing unit comprises at least two opposite support units for the at least one spring element.

6. The electrical terminal as claimed in claim 1, wherein the rotary bearing unit comprises a rotary bearing bolt on which or in which the at least one spring element is guided.

7. The electrical terminal as claimed in claim 1, wherein the mounting element has, on at least one side surface and/or inner wall, at least one blocking contour, which, in a form-fitting and/or force-fitting manner in the inoperative position with a blocking mating contour of the basic element, prevents the rotation of the basic element about the axis of rotation.

8. The electrical terminal as claimed in claim 1, wherein the mounting body has a first opening for the passage of a cable to the basic element and a further opening for receiving a plug connector and/or an adapter body for a plug connector, and wherein the first opening and the further opening merge one into the other.

9. The electrical terminal as claimed in claim 1, wherein the basic element and the head element are connected or are connectable to each other, wherein the basic element includes at least one coupling element, on which a correlating coupling element of the head element is connectable in a form-fitting and/or force-fitting manner.

10. The electrical terminal as claimed in claim 9, wherein a sealing element is arranged at a transition to the head element.

11. A production method for an electrical terminal, the electrical terminal including:

a multi-sided housing with a basic element, the basic element having at least two rear sides, and a head element, the head element being configured as a detection and/or functional element and including a detection and/or functional side; and a mounting element having a mounting body with at least two side surfaces, a base side and an inner wall, and two rear sides, the mounting element and/or the mounting body being connected to the basic element via a rotary bearing unit, which has an axis of rotation, the basic element being pivotable about the axis of rotation in an adjustment position, and i) the basic element having a single- or multi-part foot surface, and ii) the mounting element and/or the mounting body having a single- or multi-part bearing surface, the foot surface of the basic element and the bearing surface lying against each other at least with a partial area in an inoperative position of the basic element, and the at least one partial area spanning a theoretical contact plane, which is inclined in relation to the detection and/or functional side and/or a rear side by an angle of inclination, and the axis of rotation being aligned perpendicularly to the theoretical contact plane, the bearing surface and/or the foot surface, wherein the basic element is liftable from the mounting element out of the inoperative position along a direction of the axis of rotation thereby being brought into the adjustment position, wherein the foot surface of the basic element is spaced apart from the bearing surface of the mounting body in the adjustment position, and wherein the rotary bearing unit includes a spring element, the spring element being formed and mounted such that, in the adjustment position, a restoring spring force exerted by the spring element acts on the foot surface of the basic element in the direction of the bearing surface and/or the contact plane, the method comprising:

connecting the mounting element to the basic element on the rotary bearing unit; and tensioning the spring unit in one step along the axis of rotation such that the basic element is pressed onto the mounting element.

12. The production method as claimed in claim 11, wherein the head element is attached pressed onto the basic element.

13. The production method as claimed in claim 12, wherein the electrical terminal is aligned such that the head element and/or the end face of the head element faces vertically downward and subsequently the head element is filled with potting material through openings in the basic element.

14. A method for adjusting an electrical terminal, the electrical terminal containing a basic element and a mounting element, which are in mutual contact with each other in partial areas, and, in an adjustment step, the basic element being brought from an inoperative position in a linear alignment into a second inoperative position in a corner alignment, and vice versa, the method comprising the following steps:

lifting the basic element off the mounting element from the first inoperative position in a direction of an axis of rotation by a distance counter to an applied spring force;

rotating the basic element by an angular degree about the axis of rotation corresponding to the alignment of the second inoperative position; and guiding the basic element back in the direction of the spring force and parallel to the axis of rotation and bringing the basic element back into contact with the mounting element.

15. The electrical terminal as claimed in claim 1, wherein the angle of inclination is 45°.

\* \* \* \* \*